(12) United States Patent
Imori et al.

(10) Patent No.: US 10,340,207 B2
(45) Date of Patent: Jul. 2, 2019

(54) SEMICONDUCTOR PACKAGE AND METHOD OF MANUFACTURING THE SAME

(71) Applicant: Kabushiki Kaisha Toshiba, Minato-ku, Tokyo (JP)

(72) Inventors: Yoshihisa Imori, Yokohama Kanagawa (JP); Kenji Yamada, Yokohama Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/700,422

(22) Filed: Sep. 11, 2017

(65) Prior Publication Data

US 2018/0247883 A1  Aug. 30, 2018

(30) Foreign Application Priority Data

Feb. 24, 2017 (JP) ................................. 2017-033621

(51) Int. Cl.

| H01L 21/48  | (2006.01) |
|---|---|
| H01L 21/56  | (2006.01) |
| H01L 23/00  | (2006.01) |
| H01L 23/31  | (2006.01) |
| H01L 23/495 | (2006.01) |

(52) U.S. Cl.
CPC .... *H01L 23/49503* (2013.01); *H01L 21/4842* (2013.01); *H01L 21/561* (2013.01); *H01L 23/3107* (2013.01); *H01L 23/49537* (2013.01); *H01L 23/49548* (2013.01); *H01L 23/49582* (2013.01); *H01L 24/49* (2013.01); *H01L 24/97* (2013.01); *H01L 2224/48091* (2013.01); *H01L 2224/48247* (2013.01)

(58) Field of Classification Search
None
See application file for complete search history.

(56) References Cited

U.S. PATENT DOCUMENTS

| 2011/0248393 A1* | 10/2011 | Lu ....................... H01L 23/3107 257/676 |
| 2016/0118320 A1* | 4/2016 | Coppone ........... H01L 23/49568 257/666 |

FOREIGN PATENT DOCUMENTS

JP    2006-60141 A    3/2006

\* cited by examiner

*Primary Examiner* — Thien F Tran
(74) *Attorney, Agent, or Firm* — White & Case LLP (57) ABSTRACT

According to one embodiment, a semiconductor package includes a die pad, a semiconductor chip, a lead frame, and an insulating part. The semiconductor chip is provided on the die pad. The lead frame is separated from the die pad. The lead frame is electrically connected to a terminal of the semiconductor chip. The lead frame includes a first part and a second part disposed between the first part and the die pad. An upper surface of the first part is located below an upper surface of the second part. The insulating part is provided on the die pad, the semiconductor chip, and the second part. The insulating part seals the semiconductor chip.

4 Claims, 7 Drawing Sheets

SEMICONDUCTOR PACKAGE AND METHOD OF MANUFACTURING THE SAME

CROSS-REFERENCE TO RELATED APPLICATIONS

This application is based upon and claims the benefit of priority from Japanese Patent Application No. 2017-033621, filed on Feb. 24, 2017; the entire contents of which are incorporated herein by reference.

FIELD

Embodiments described herein relate generally to a semiconductor package and a method of manufacturing the same.

BACKGROUND

It is desired for the semiconductor package to be hard to cause faulty connection or the like when mounting, and high in reliability.

DETAILED DESCRIPTION

According to one embodiment, a semiconductor package includes a die pad, a semiconductor chip, a lead frame, and an insulating part. The semiconductor chip is provided on the die pad. The lead frame is separated from the die pad. The lead frame is electrically connected to a terminal of the semiconductor chip. The lead frame includes a first part and a second part disposed between the first part and the die pad. An upper surface of the first part is located below an upper surface of the second part. The insulating part is provided on the die pad, the semiconductor chip, and the second part. The insulating part seals the semiconductor chip.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

Figure 1:
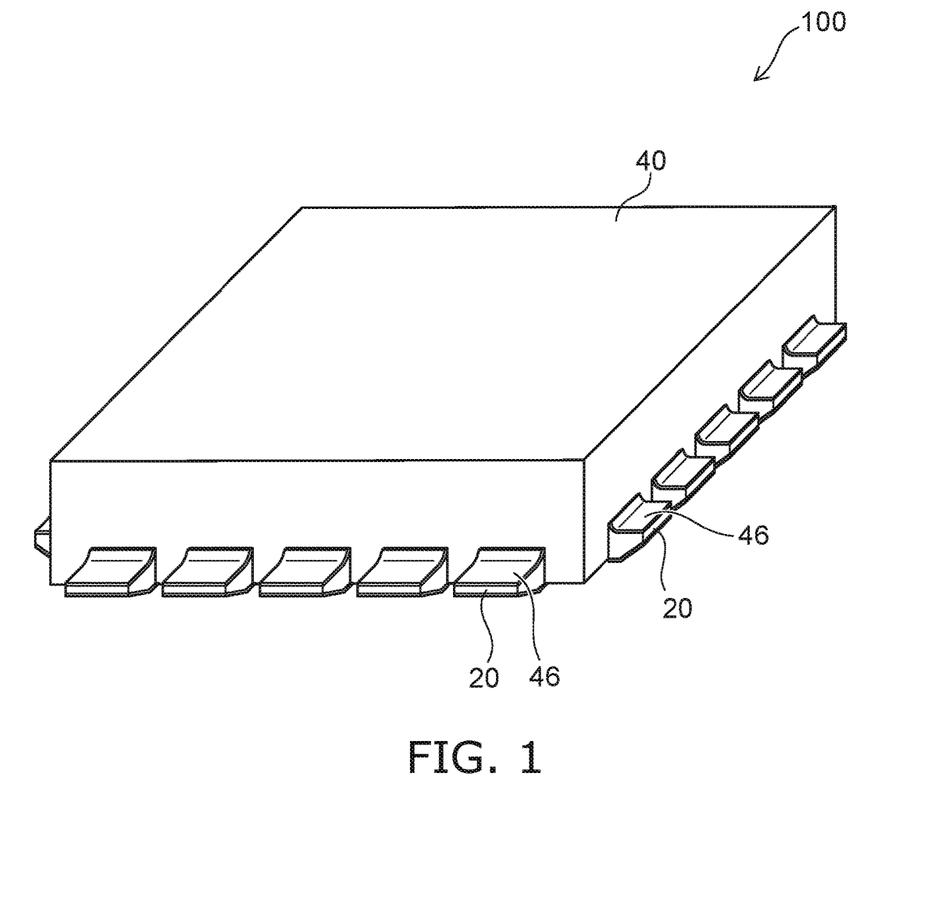
FIG. 1 is a perspective view showing a semiconductor package according to an embodiment.

FIG. 1 is a perspective view showing a semiconductor package 100 according to an embodiment.

Figure 2A:
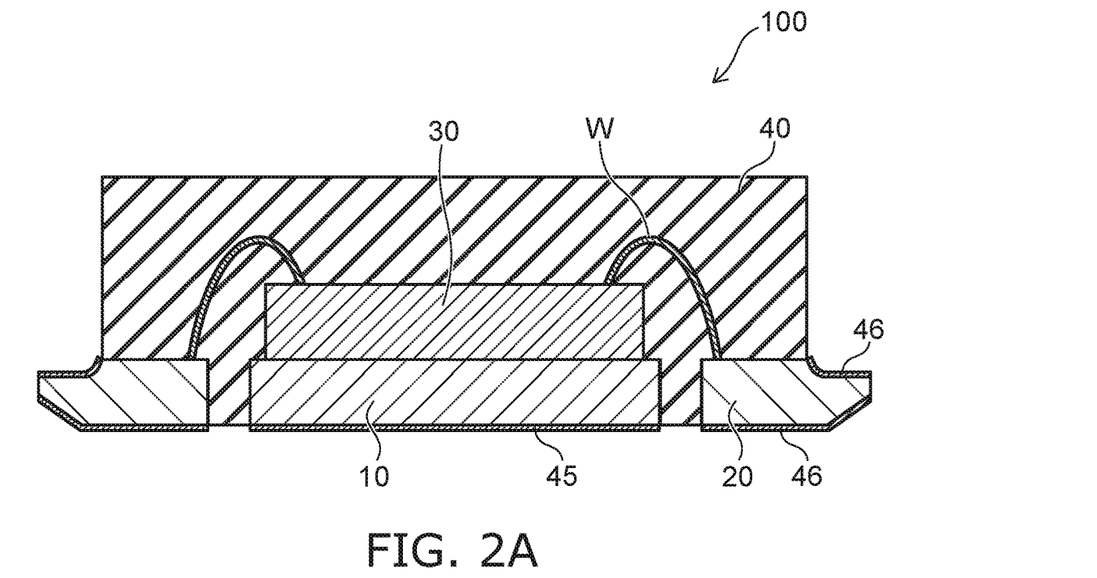
FIG. 2A is a cross-sectional view showing the semiconductor package according to the embodiment and FIG. 2B is a cross-sectional view showing a lead frame of the semiconductor package according to the embodiment.
Figure 2B:
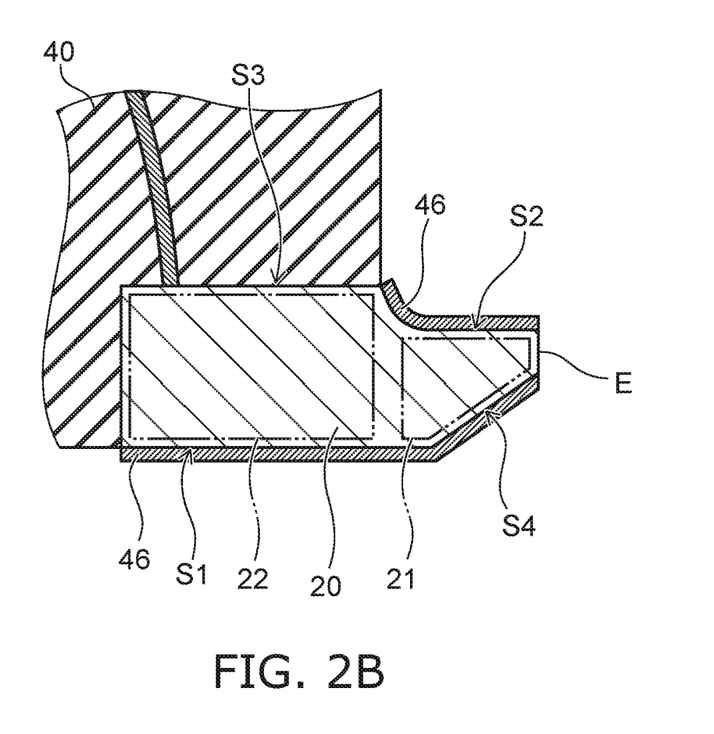

FIG. 2A is a cross-sectional view showing the semiconductor package 100 according to the embodiment, and FIG. 2B is a cross-sectional view showing a lead frame 20 of the semiconductor package 100 according to the embodiment.

The semiconductor package 100 is, for example, a package of a QFN (Quad Flat Non-leaded) type.

As shown in FIG. 1, FIG. 2A, and FIG. 2B, the semiconductor package 100 includes a die pad 10, the lead frames 20, a semiconductor chip 30, an insulating part 40, and metal layers 45, 46.

As shown in FIG. 2A, the die pad 10 and the lead frames 20 are provided so as to be separated from each other in a lower part of the semiconductor package 100. The die pad 10 is provided on the center side of the semiconductor package 100. As shown in FIG. 1, the lead frames 20 are provided in the circumferential direction around the die pad 10.

As shown in FIG. 2A, the semiconductor chip 30 is provided on the die pad 10. The semiconductor chip 30 is bonded to the upper surface of the die pad 10 with a paste not shown. The paste may include particles of metal such as silver.

As shown in FIG. 2B, the lead frame 20 includes a first part 21 and a second part 22. The second part 22 is provided between the die pad 10 and the first part 21. The first part 21 and the second part 22 have, for example, a lower surface S1 in common. An upper surface S2 of the first part 21 is located below an upper surface S3 of the second part 22. Therefore, the thickness of the first part 21 is smaller than the thickness of the second part 22.

A tilted surface S4 is formed in a lower part of the tip on the outer side of the lead frame 20. Specifically, as shown in FIG. 2B, the lead frame 20 has an end part E in a first direction from the die pad 10 toward the lead frame 20. The first direction may be a direction from the center of the semiconductor package 100 toward the outside. The first part 21 has the tilted surface S4 tilted upward along the first direction between the lower surface S1 and the end part E. Therefore, at least a part of the lower surface of the first part 21 is located above the lower surface of the second part 22.

The tilted surface S4 is provided only to the first part 21 in the example shown in FIG. 2A and FIG. 2B. The tilted surface S4 may be provided so as to straddle the first part 21 and the second part 22. A surface perpendicular to the first direction is provided between the upper surface S2 and the tilted surface S4 in the example shown in the drawings. It is also possible to provide the tilted surface S4 so as to be connected to the upper surface S2 without providing the perpendicular surface.

The second part 22 of the lead frame 20 is electrically connected to a terminal not shown provided on an upper surface of the semiconductor chip 30 with a bonding wire W. Further, the insulating part 40 is provided on the die pad 10, the second part 22, and the semiconductor chip 30. The semiconductor chip 30 is sealed by the insulating part 40. The lower surface of the die pad 10, the lower surface S1 of the lead frame 20, and the first part 21 are not covered with the insulating part 40, but are exposed to the outside.

The metal layer 45 is provided on the lower surface of the die pad 10. A plurality of the metal layer 46 is provided on the lower surface S1 of the lead frame 20, the tilted surface S4, and the upper surface S2 of the first part 21. It is also possible for the metal layer 46 not to be provided on the tilted surface S4, but to be provided only on the lower surface S1 and the upper surface S2.

Here, an example of a material of each of the constituents will be described.

The die pad 10 and the lead frames 20 include a metal material such as copper. The semiconductor chip 30 includes a semiconductor material such as silicon as a principal component. The insulating part 40 includes insulating resin such as epoxy resin.

The metal layers 45, 46 each include a metal material which can be formed on the die pad 10 and the lead frames 20 using a plating method. In the case in which the lead frames include copper, the metal layers 45, 46 include tin, an alloy of silver and tin, or the like.

Then, a method of manufacturing the semiconductor package 100 according to the embodiment will be described.

FIG. 3A, FIG. 3B, FIG. 4A and FIG. 4B are process cross-sectional views showing an example of a manufacturing process of the semiconductor package 100 according to the embodiment.

Figure 3A:
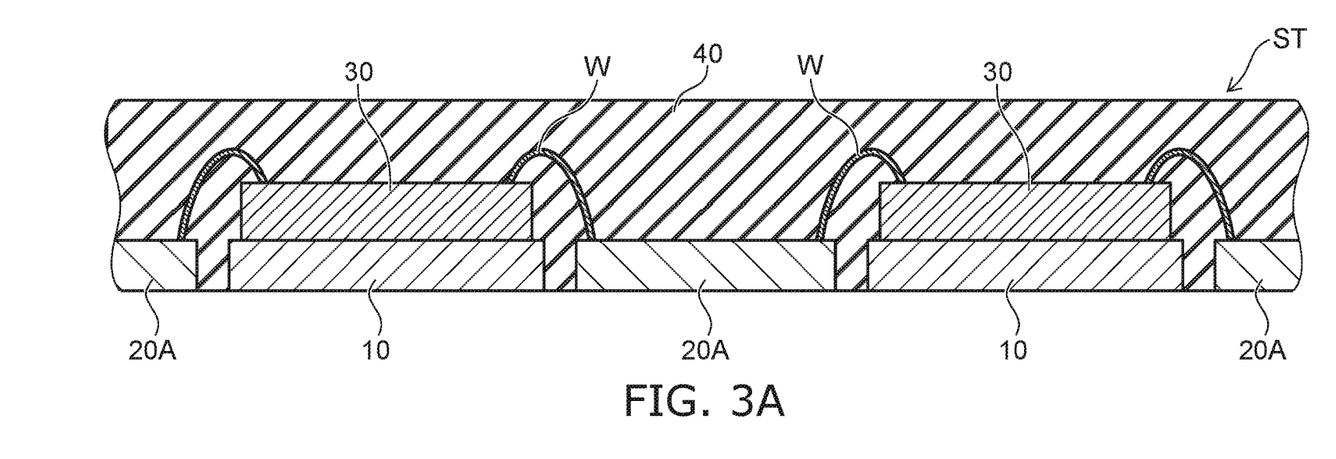
FIG. 3A, FIG. 3B, FIG. 4A and FIG. 4B are process cross-sectional views showing an example of a manufacturing process of the semiconductor package according to the embodiment.

A structure ST shown in FIG. 3A is prepared. The structure ST includes a plurality of die pads 10, a plurality of lead frame members 20A, a plurality of semiconductor chips 30, and the insulating part 40 provided on these constituents.

The plurality of die pads 10 are arranged so as to be separated from each other. The semiconductor chips 30 are respectively provided on the die pads 10. The lead frame member 20A is to be processed in a later process to provide the lead frames 20. The lead frame members 20A are provided between the die pads 10. The insulating part 40 seals the plurality of semiconductor chips 30.

Figure 3B:
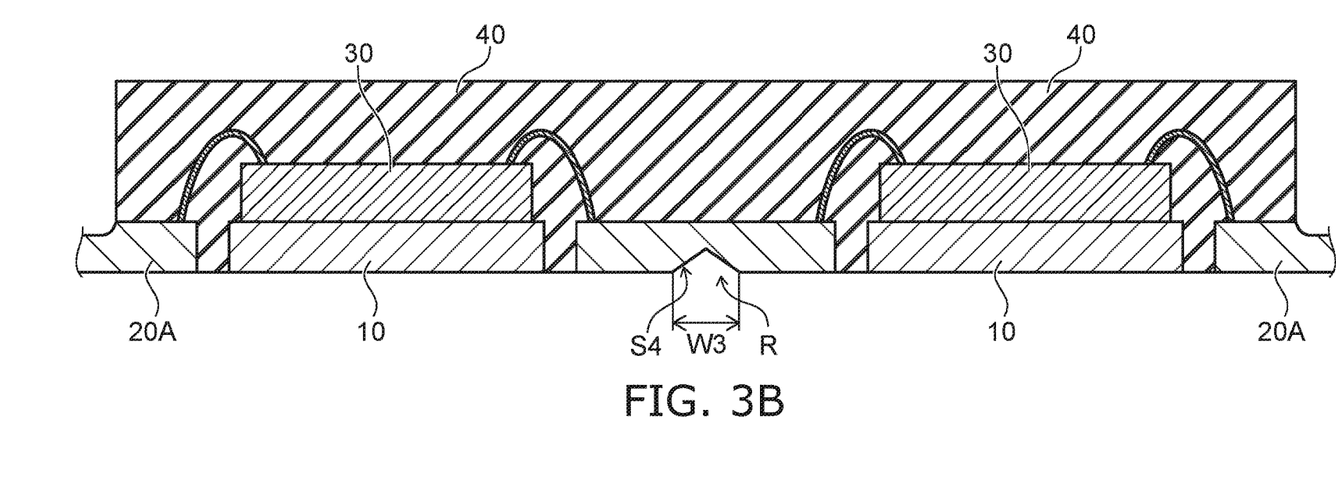

As shown in FIG. 3B, a recess R is formed on the lower surface of the lead frame member 20A. The recess R is formed in the part in which the lead frame member 20A is cut in a subsequent process. The recess R has width W3 (third width) wider than actual width W2 (second width) with which the lead frame member 20A is cut. Further, the recess R has the tilted surfaces S4 tilted upward toward the part to be cut.

The recess R is formed on the lower surface of the lead frame member 20A. The recess R is formed using a blade or a belt, which is rotating, to grind the lower surface. Alternatively, it is also possible to form the recess R by performing a blast process on a part of the lead frame member 20A to grind the part. Alternatively, it is also possible to form the recess R by pressure-caving a part of the lower surface of the lead frame member 20A.

A part of the insulating part 40 is removed from above to form a groove T having width W1 (first width). The width W1 is wider than the width W2 and the width W3. Due to this process, a part of the lead frame member 20A is exposed through the groove T, and at the same time, a part of the upper surface of the lead frame member 20A is removed. The groove T can be formed using blade dicing, laser dicing, plasma dicing, or the like.

Figure 4A:
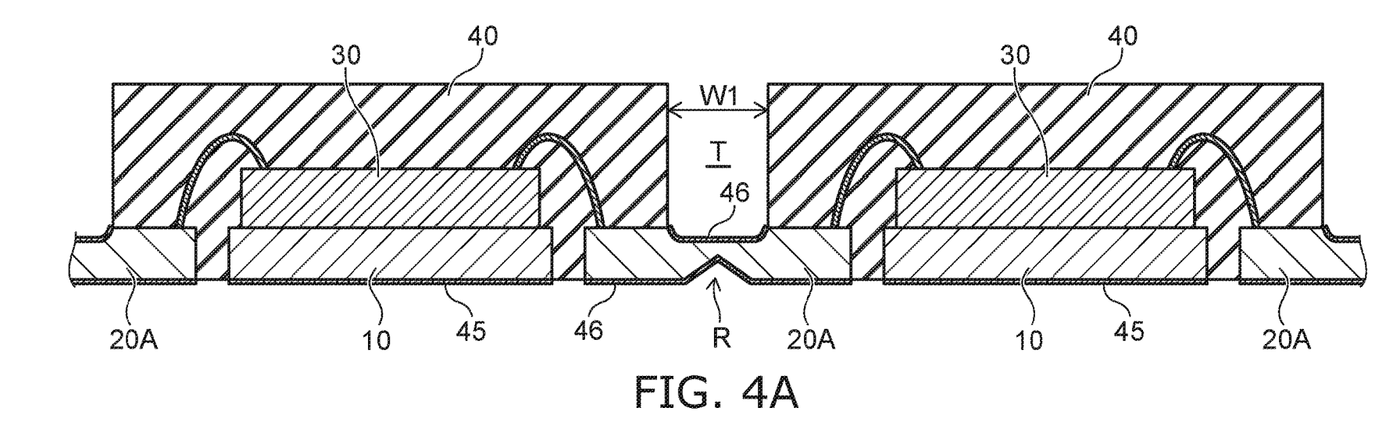

After forming the groove T, removal of the burrs caused when forming the groove T and the recess R is performed. As shown in FIG. 4A, the metal layer 45 is formed on the lower surface of the die pad 10, and the metal layers 46 are formed on the upper surface, the lower surface and the tilted surface S4 of the lead frame member 20A using a plating method.

Figure 4B:
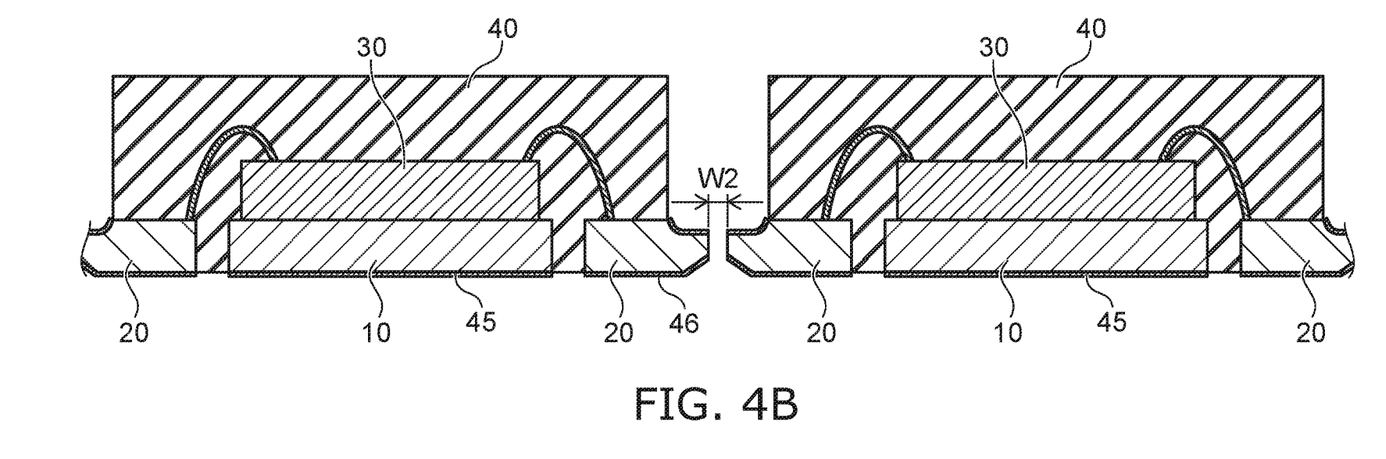

As shown in FIG. 4B, the lead frame member 20A is cut to be divided into the plurality of lead frames 20. The lead frame member 20A is exposed by the groove T, and is then cut in the part provided with the recess R. The width W2 with which the lead frame member 20A is cut is narrower than the width W1 of the groove T and the width W3 of the recess R. Therefore, the first part 21 with the upper surface recessed is provided to the lead frame 20 after cutting. The tilted surface S4 of the recess R remains in the lower part of the tip of the lead frame 20.

Due to the process described hereinabove, the semiconductor package 100 according to the embodiment is fabricated.

In the example shown in FIG. 3A through FIG. 4B, the tilted surface S4 is provided to the lead frame 20 by forming the recess R and then cutting the lead frame member 20A. However, the method according to the embodiment for manufacturing the semiconductor package 100 is not limited to this example. For example, it is also possible to form the tilted surface S4 by cutting the lead frame member 20A and then removing a lower part of the cutting surface of the lead frame 20. In this case, the metal layer 46 is not formed on the tilted surface S4.

Here, a first advantage of the embodiment will be described.

When cutting the structure ST shown in FIG. 3A, the larger the thickness is, the wider the width of the cut part becomes. This is because if a member large in thickness is cut with narrow width, the time taken for the process becomes too long.

On the other hand, the wider the cutting width is, the wider the width of the part of the lead frame member 20A to be removed becomes. Therefore, the more the area of the lower surface S1 of the lead frame 20 decreases. Since the lower surface S1 and an external electrode are bonded to each other when mounting the semiconductor package 100, if the area of the lower surface S1 decreases, faulty connection and so on becomes apt to occur when mounting. Thus, the reliability of the semiconductor package 100 degrades.

In the method of manufacturing the semiconductor package 100 according to the embodiment, the groove T is formed by removing a part of the insulating part 40. Then the lead frame member 20A is cut with the width narrower than that of the groove T. As described above, by cutting the insulating part 40 thicker than the lead frame member 20A with wider width, and then cutting the lead frame member 20A, which is thinner, with narrower width, it is possible to increase the area of the lower surface S1 obtained by cutting while preventing the process time from increasing.

Therefore, in the method of manufacturing the semiconductor package according to the embodiment, it is possible to manufacture the semiconductor package high in mounting reliability.

Further, in the method of manufacturing the semiconductor package 100 according to the embodiment, in the case of cutting the lead frame member 20A and the insulating part 40 with blades, it is possible to use the blade for cutting the insulating part 40 and the blade for cutting the lead frame member 20A separately from each other. For example, by cutting the lead frame member 20A more easily stretched compared to the insulating part 40 with a blade, which is high in autogenous action as a grinding stone, and is more suitable for cutting ductile materials, it becomes hard for clogging of the blade and so on to occur, and it is possible to improve the productivity of the semiconductor package 100.

Further, it is possible to decrease the thickness of the lead frame member 20A to be cut in the subsequent process by removing a part of the lead frame member 20A as shown in FIG. 3B when forming the groove T. Therefore, according to the manufacturing method, it is possible to cut the lead frame member 20A with narrower width, and thus, it is possible to fabricate the semiconductor package higher in mounting reliability.

If the insulating part 40 and the lead frame member 20A are cut in a lump with wider cutting width when processing the structure ST, the tip surface of the lead frame 20 becomes coplanar with the side surface of the insulating part 40, and the lead frame 20 is not provided with the first part 21. In contrast, in the semiconductor package 100 according to the embodiment, the lead frame 20 includes the first part 21 and the second part 22. Therefore, compared to the case in which the lead frame 20 includes only the second part 22, it is possible to increase the area of the lower surface S1 of the lead frame 20 to thereby improve the mounting reliability of the semiconductor package.

Further, if deformation such as warpage exists in the board, on which the semiconductor package 100 is mounted, when mounting the semiconductor package 100, stress occurs in the semiconductor package 100 due to the deformation, and there is a possibility that the semiconductor package 100 is damaged. In this regard, in the semiconductor package 100 according to the embodiment, the upper surface S2 of the first part 21 is located below the upper surface S3 of the second part 22 to make the thickness of the first part 21 smaller. According to such a configuration, it is possible to enhance the flexibility of the first part 21 to thereby absorb the stress applied to the semiconductor package 100 when mounting, and thus, it is possible to prevent the damage in the semiconductor package 100 when mounting from occurring.

In addition, since the thickness of the first part 21 is made smaller, it becomes easy for solder to wrap around the upper part of the first part when mounting the semiconductor package 100, and it is possible to increase the connection strength between the lead frame 20 and the external electrode. Therefore, it is possible to further improve the mounting reliability of the semiconductor package.

Therefore, according to the embodiment, it is possible to prevent the damage in the semiconductor package 100 when mounting from occurring, and at the same time increase the connection strength while suppressing the faulty connection to thereby improve the reliability of the semiconductor package 100.

Then, a second advantage of the embodiment will be described.

In the semiconductor package 100 according to the embodiment, the lead frame 20 has the tilted surface S4. In the case in which the lead frame 20 has the tilted surface S4, when mounting the semiconductor package 100, the solder becomes apt to flow to the side surface of the lead frame 20 along the tilted surface S4, and thus solder fillet becomes apt to be formed. If the solder fillet is formed on the side surface of the lead frame 20, it is possible to easily check whether or not the semiconductor package 100 is sufficiently bonded to the external electrode by the appearance inspection.

Therefore, according to the embodiment, the solder fillet is apt to be formed when mounting the semiconductor package 100, and it is possible to make the appearance inspection easy. Further, in the manufacturing method according to the embodiment, it is possible to manufacture the semiconductor package 100, with which the solder fillet is apt to be formed and the appearance inspection of which is easy.

It is desired for the lead frame 20 to be provided with the metal layer 46 formed on the tilted surface S4 in addition to the lower surface S1 and the upper surface S2 as shown in FIGS. 2A and 2B. This is because in the case in which the metal layer 46 is provided on the tilted surface S4, when mounting the semiconductor package 100, the solder becomes more apt to flow to the side surface of the lead frame 20 along the tilted surface S4.

The lead frame 20 provided with the metal layer 46 disposed on the tilted surface S4 can be obtained by forming the recess R on the lower surface of the lead frame member 20A, then forming the metal layer 46 on the tilted surfaces of the recess R, and then cutting the lead frame member 20A as shown in FIG. 4A and FIG. 4B. Therefore, according to this manufacturing method, it is possible to manufacture the semiconductor package 100 with which the solder fillet is more apt to be formed.

The tilted surface S4 can also be formed by cutting the lead frame member 20A and then removing the lower part of the cutting surface of the lead frame 20. In this case, the metal layer 46 is not formed on the tilted surface S4. However, according to such a manufacturing method, by removing the lower part of the cutting surface, it is possible to remove the burrs of the lead frame 20 formed when cutting the lead frame member 20A. By removing the burrs of the lead frame 20, it is possible to reduce the possibility that the lead frame 20 is electrically connected to an unintended electrode when mounting the semiconductor package 100 to thereby improve the reliability. Therefore, according to this manufacturing method, it is possible to manufacture the semiconductor package 100 high in mounting reliability.

It should be noted that the configurations of the semiconductor package 100 respectively related to the first and second advantages can be used in combination, and the methods of manufacturing the semiconductor package 100 respectively related to the first and second advantages can be used in combination. Due to the combination, it is possible to obtain the semiconductor package 100 with which the solder fillet is apt to be formed, and which is high in mounting reliability.

First Modified Example

Figure 5A:
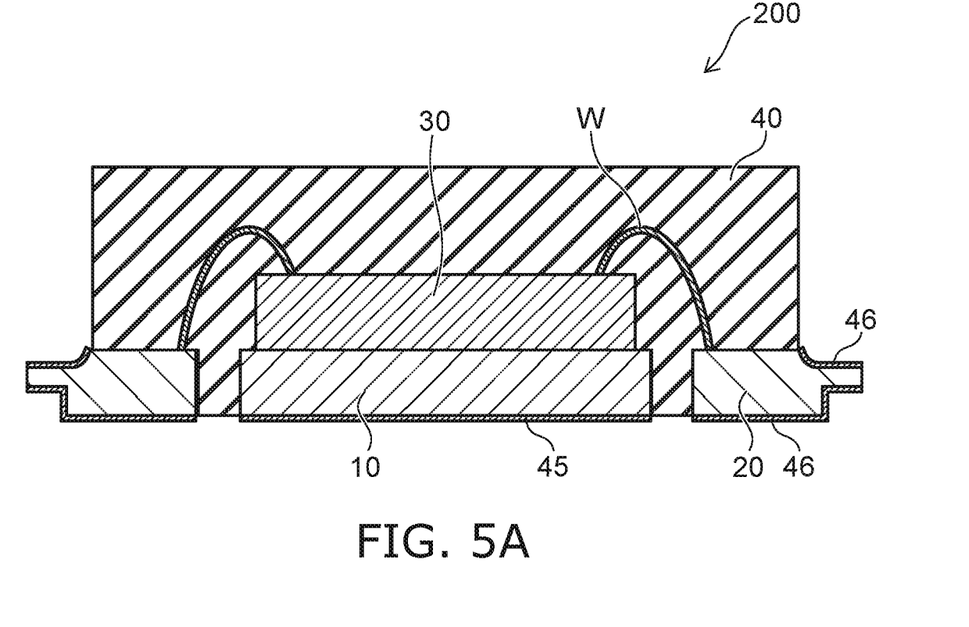
FIG. 5A is a cross-sectional view showing a semiconductor package according to a first variation of the embodiment and FIG. 5B is a cross-sectional view showing the lead frame of the semiconductor package according to the first variation of the embodiment.
Figure 5B:
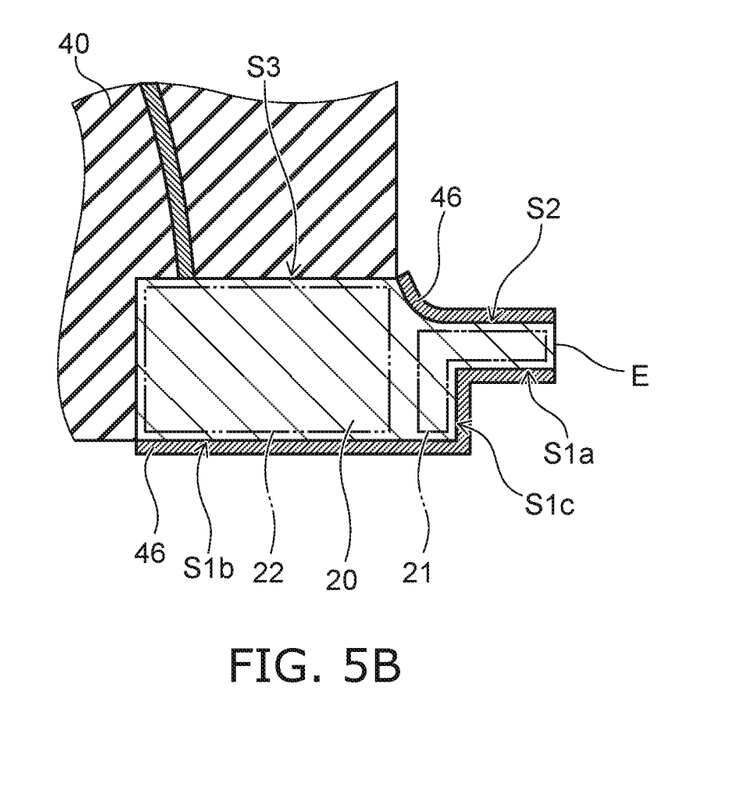

FIG. 5A is a cross-sectional view showing a semiconductor package 200 according to a first variation of the embodiment, and FIG. 5B is a cross-sectional view showing the lead frame 20 of the semiconductor package 200 according to the first variation of the embodiment.

The semiconductor package 200 has a difference in the shape of the lead frame 20 from the semiconductor package 100. Specifically, as shown in FIG. 5B, a step is formed on the lower surface of the first part 21 of the lead frame 20, and a lower surface S1$a$ on the end part E side of the lead frame 20 is located above a lower surface S1$b$ on the die pad 10 side.

A surface S1$c$ between the lower surface S1$a$ and the lower surface S1$b$ is, for example, roughly perpendicular to the lower surface S1$a$ and the lower surface S1$b$. The metal layer 46 is provided on the lower surface S1$a$. As shown in FIGS. 5A and 5B, the metal layer 46 can also be provided further on the lower surface S1$b$ and the surface S1$c$.

The semiconductor package 200 according to the variation can be fabricated by the following manufacturing method. Firstly, substantially the same process as shown in FIG. 3A is performed. Then, the recess R having side walls roughly perpendicular to the lower surface of the lead frame member 20A is provided to the lower surface.

Also in this case, the recess R has the width W3 (the third width) wider than the actual width W2 (the second width) with which the lead frame member 20A is cut. Then, similarly to the process shown in FIG. 4A, the groove T having the width W1 is provided to the insulating part 40, and then, the metal layer 45 and the metal layers 46 are formed. Subsequently, similarly to the process shown in FIG. 4B, by cutting the lead frame member 20A with the width W2, the semiconductor package 200 according to the variation is manufactured.

Further, in the manufacturing method described above, it is also possible to cut the lead frame member 20A and then remove the lower part of the cutting surface of the lead frame 20 to thereby form the step similarly to the method of manufacturing the semiconductor package 100. According also to this manufacturing method, it is possible to locate the lower surface on the cutting surface side of the lead frame 20 above the lower surface on the die pad 10 side. In this case, the metal layer 46 is not formed on the lower surface S1$b$ and the surface S1$c$.

In the semiconductor package 200 according to the variation, the step is formed on the lower surface on the end part E side of the lead frame 20, and at least a part of the lower surface of the first part 21 is located above the lower surface of the second part 22. Therefore, according to the variation, similarly to the embodiment described above, it is possible to prevent the damage in the semiconductor package 200 when mounting from occurring, and at the same time increase the connection strength while suppressing the faulty connection to thereby improve the reliability of the semiconductor package 200.

It should be noted that the specific shape of the bottom part of the lead frame 20 is not limited to the shape shown in FIG. 1 through FIGS. 5A and 5B providing the thickness of the first part 21 can be made smaller than that of the second part 22, but can arbitrarily be changed. It should be noted that the structure of the semiconductor package 100 shown in FIGS. 2A and 2B is more desired in the point that the distance between the external electrode, on which the semiconductor package 100 is mounted, and the tilted surface S4 gradually increases toward the outside, and thus, the solder is apt to flow to the side surface of the lead frame 20, and therefore the solder fillet is more apt to be formed.

Second Modified Example

Figure 6:
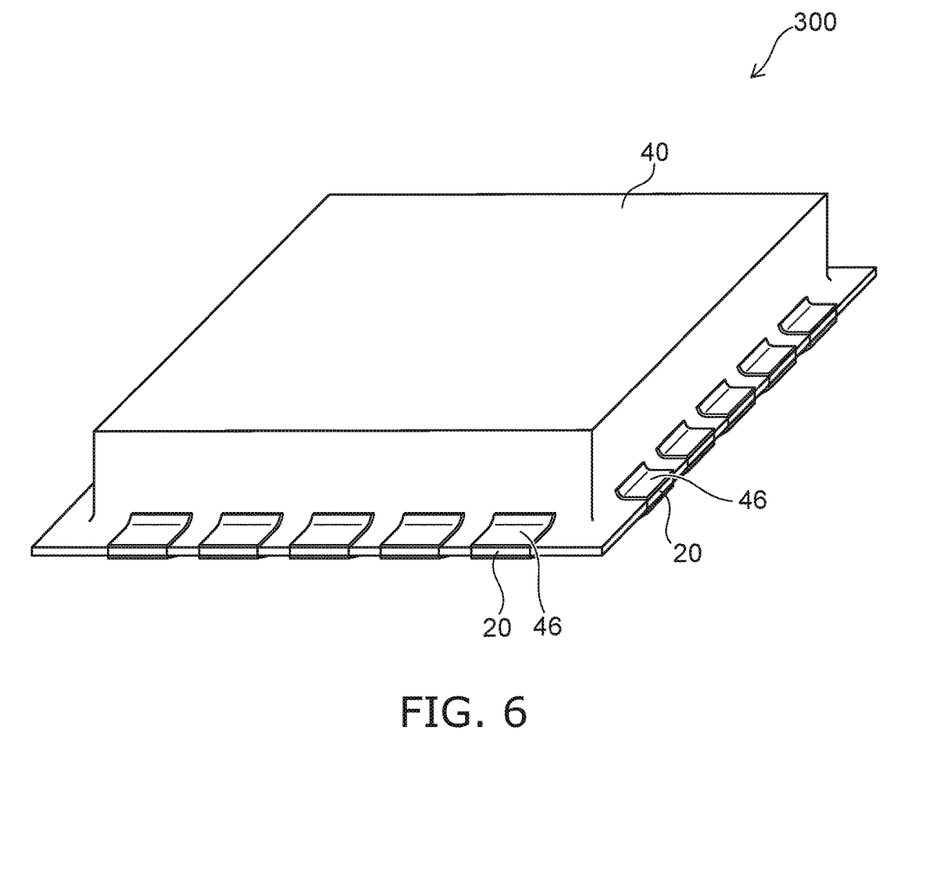
FIG. 6 is a perspective view showing a semiconductor package according to a second variation of the embodiment.

FIG. 6 is a perspective view showing a semiconductor package 300 according to a second variation of the embodiment.

The semiconductor package 300 according to the variation is different from the semiconductor package 100 in the point that a part of the insulating part 40 is disposed between the lead frames 20.

In the manufacturing process of the semiconductor package 100, the semiconductor package 100 is fabricated by forming the recess R on the lower surface of the lead frame member 20A, and then removing the part of the insulating part 40 located between the lead frame members 20A before forming the metal layers 45, 46 shown in FIG. 4A.

In contrast, the semiconductor package 300 shown in FIG. 6 is fabricated by cutting the lead frame member 20A without removing the part of the insulating part 40 between the lead frame members 20A.

According also to the variation, similarly to the embodiment described above, the solder fillet is apt to be formed when mounting the semiconductor package 300, and it is possible to make the appearance inspection easy.

As described above, regarding the semiconductor package according to the embodiment of the invention, as long as the lower surface S1 and the tilted surface S4 of the lead frame 20 are exposed, the structure related to the other parts can arbitrarily be modified.

Third Modified Example

Figure 7:
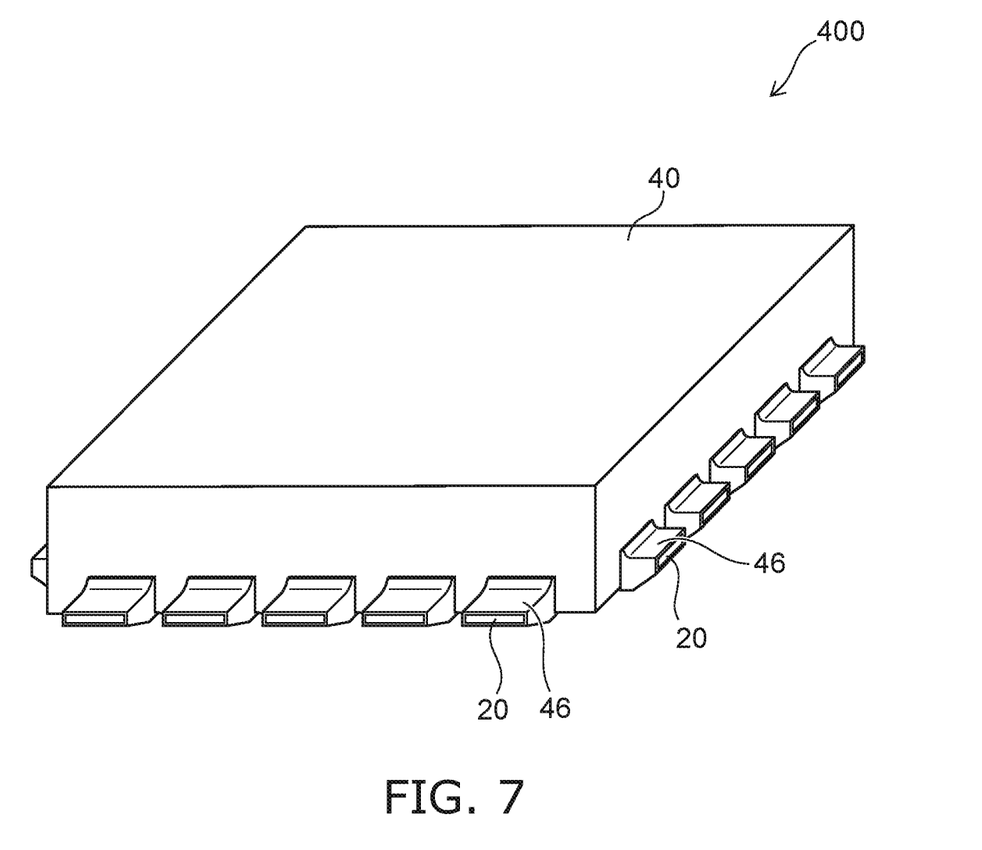
FIG. 7 is a perspective view showing a semiconductor package according to a third variation of the embodiment.

FIG. 7 is a perspective view showing a semiconductor package according to a third variation of the embodiment.

The semiconductor package 400 according to the variation is different from the semiconductor package 100 in the point of the configuration of the metal layer 46. The metal layer 46 is further provided on the side surfaces of the lead frame 20. The side surfaces are along the first direction and a second direction. The first direction may be a direction from the center of the semiconductor package 400 toward the outside. The second direction may be from the lower surface of the lead frame 20 toward the upper surface of the lead frame 20. The metal layer 46 can suppress corrosion of the side surfaces of the lead frame 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor package comprising:
   a die pad;
   a semiconductor chip provided on the die pad;
   a lead frame separated from the die pad, the lead frame being electrically connected to a terminal of the semiconductor chip, the lead frame including a first part and a second part disposed between the first part and the die pad, an upper surface of the first part being located below an upper surface of the second part, the first part having a first surface perpendicular to a first direction, the first direction being from the die pad toward the lead frame, a lower end of the first surface being located above a lower surface of the second part and below an upper surface of the die pad; and
   an insulating part provided on the die pad, the semiconductor chip, and the second part, the insulating part sealing the semiconductor chip.

2. The semiconductor package according to claim 1, further comprising a bonding wire contacting the terminal of the semiconductor chip and the upper surface of the second part.

3. The semiconductor package according to claim 1, wherein a length in the first direction of the second part is longer than a length in the first direction of the first part.

4. The semiconductor package according to claim 1, wherein
   at least a part of a lower surface of the first part is located above the lower surface of the second part and below the upper surface of the die pad, and
   the part of the lower surface of the first part and the lower surface of the second part are along the first direction.

* * * * *